United States Patent
Wu et al.

(10) Patent No.: US 9,343,371 B1
(45) Date of Patent: May 17, 2016

(54) FABRICATING FIN STRUCTURES WITH DOPED MIDDLE PORTIONS

(71) Applicant: GLOBALFOUNDRIES Inc., Grand Cayman (KY)

(72) Inventors: Xusheng Wu, Ballston Lake, NY (US); Jin Ping Liu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/725,552

(22) Filed: May 29, 2015

Related U.S. Application Data (60) Provisional application No. 62/101,657, filed on Jan. 9, 2015.

(51) Int. Cl.
*H01L 21/8238* (2006.01)
*H01L 29/66* (2006.01)
*H01L 21/8234* (2006.01)

(52) U.S. Cl.
CPC ...... *H01L 21/823821* (2013.01); *H01L 21/823412* (2013.01); *H01L 21/823431* (2013.01); *H01L 21/823481* (2013.01); *H01L 21/823807* (2013.01); *H01L 29/66803* (2013.01)

(58) Field of Classification Search
CPC .............. H01L 21/823821; H01L 21/823412; H01L 21/823431; H01L 21/823807; H01L 21/823481
See application file for complete search history.

(56) References Cited

U.S. PATENT DOCUMENTS

| 9,252,243 | B2 * | 2/2016 | He | H01L 29/66795 |
| 2013/0280883 | A1 | 10/2013 | Faul et al. | |
| 2013/0313619 | A1 * | 11/2013 | Fumitake | H01L 21/845 257/288 |
| 2015/0162436 | A1 * | 6/2015 | Toh | H01L 29/785 257/401 |
| 2015/0228762 | A1 * | 8/2015 | He | H01L 29/66795 257/410 |
| 2015/0295087 | A1 * | 10/2015 | Cheng | H01L 29/7851 257/192 |
| 2016/0005738 | A1 * | 1/2016 | Liu | H01L 27/0924 257/369 |

* cited by examiner

*Primary Examiner* — Mamadou Diallo
(74) *Attorney, Agent, or Firm* — Heslin Rothenberg Farley and Mesiti PC; Nicholas Mesiti (57) ABSTRACT

Methods are provided for fabricating fin structures. The methods include: fabricating at least one fin structure, the at least one fin structure having a doped middle portion separating an upper portion from a lower portion, and the fabricating comprising: providing an isolation layer in contact with the lower portion of the at least one fin structure; forming a doping layer above the isolation layer and in contact with the at least one fin structure; and annealing the doping layer to diffuse dopants therefrom into the at least one fin structure to form the doped middle portion thereof, wherein the isolation layer inhibits diffusion of dopants from the doping layer into the lower portion of the at least one fin structure.

20 Claims, 6 Drawing Sheets

FABRICATING FIN STRUCTURES WITH DOPED MIDDLE PORTIONS

CROSS-REFERENCE TO RELATED APPLICATION

This application claims the benefit of U.S. Provisional Patent Application No. 62/101,657, filed Jan. 9, 2015, which is hereby incorporated herein by reference in its entirety.

FIELD OF THE INVENTION

The present invention relates to methods of fabricating semiconductor structures and more particularly to methods of fabricating fin structures with doped middle portions.

BACKGROUND OF THE INVENTION

Complementary metal oxide semiconductor (CMOS) technology continues to be widely used in the fabrication of integrated circuits. As integrated circuit density continues to increase, semiconductor devices with three-dimensional vertical fin structures have been developed to replace conventional planar devices, because devices with fin structures can provide higher performance at a smaller footprint than planar devices. However, increased density, with smaller critical dimensions, can introduce fabrication challenges. Therefore, further enhancements in fabrication techniques for fin structures continue to be pursued.

BRIEF SUMMARY

The shortcomings of the prior art are overcome, and additional advantages are provided, through the provision, in one aspect, of a method. The method includes: fabricating at least one fin structure, the at least one fin structure having a doped middle portion separating an upper portion from a lower portion, and the fabricating comprising: providing an isolation layer in contact with the lower portion of the at least one fin structure; forming a doping layer above the isolation layer and in contact with the at least one fin structure; and annealing the doping layer to diffuse dopants therefrom into the at least one fin structure to form the doped middle portion thereof, wherein the isolation layer inhibits diffusion of dopants from the doping layer into the lower portion of the at least one fin structure.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and not by way of limitation. Various substitutions, modifications, additions, and/or arrangements, within the spirit and/or scope of the underlying inventive concepts will be apparent to those skilled in the art from this disclosure.

The present disclosure describes, in part, fabrication methods for fin structures with doped middle portions. By way of explanation, in the fabrication of integrated circuits with smaller critical dimensions and greater device density, semiconductor devices with three-dimensional vertical fin structures are desirable to allow higher performance, such as a higher ratio of on-current to off-current.

For instance, in one fabrication example, channel regions of transistors, such as fin-type field-effect transistors (fin FETs), are formed within upper portions of the fin structures. Next, conformal gate structures are formed to wrap around the upper portions of the fin structures, to provide gate control on three sides of the upper portion of the fin structure, allowing for an applied gate voltage to better control turning the transistor on or off. Because the conformal gate structures can be in contact with three sides of the fin structures, the entire upper portions of the fin structures can be active regions of the transistors, facilitating increased on-current.

However, when such transistors are fabricated at small critical dimensions, such as gate lengths of 20 nanometers or less, there can be problems, including short channel effects, such as leakage currents which flow from the channel regions to the underlying substrate even when the transistors are turned off by controlling the gate voltage. For example, leakage current increases power consumption, generates heat, and otherwise decreases performance of the transistor. In order to reduce and/or eliminate such leakage currents, the present technique provides for forming a doped middle portion of the fin structure, located below the upper portion. In one example, the doped middle portion can include relatively high channel doping, with the doping type being opposite to the doping type of the source region and/or drain region doping, and can be used to reduce leakage currents, such as punch-through leakage current, and the doped middle portions can be referred to as punch-through stop portions. In such an example, leakage currents will be inhibited from flowing between upper portions and lower portions by doped middle portions of fin structures.

In addition, doping the middle portions of fin structures can be difficult to achieve without introducing other problems or complexities. For example, dopants can be implanted from the top of the fin structures using a specific implantation energy selected so that the dopants reach a specific depth into the fin structures, for example, a target depth being the middle portions of the fin structures. However, because the implanted dopants will have a range of energies, for example, following a Gaussian distribution, in such a case, some concentration of dopants will appear even in the upper portions of the fin structures, as well as the lower portions of the fin structure. Therefore, dopants in the upper portions of the fin structure can have adverse effects. For instance, such dopants can modify the threshold voltage characteristics of transistors formed with channel regions including the upper portions of the fin structure. In addition, dopants in upper portions of fin structures can introduce mobility degradation for fin-type devices which use the upper portions of the fin structures as channel regions.

In certain applications, such as static random access memory (SRAM), multiple transistors are used to form a memory cell, and the threshold voltages must match closely. For example, random dopant concentrations in the upper portions of the fin structure can lead to device faults and poor performance. In addition, dopants in the lower portions of the fin structure can be problematic for transistors formed in a substrate well, because the dopants can interfere with the substrate dopants and interrupt the junction, leading to well leakage.

In another example, various applications can require transistors with different threshold voltage characteristics. Therefore, in the design of integrated circuits, it may be desirable to optimize leakage power consumption and speed of the integrated circuit by having different portions of the integrated circuit use transistors with different threshold voltage characteristics. For example, it may be desirable to perform arithmetic or logic functions at a relatively high speed to enable advanced features, but perform memory storage at a lower speed to save power. In addition, because CMOS technology makes use of n-type and p-type transistors, there can be a requirement for matched threshold voltages of n-type and p-type transistors.

Advantageously, the present techniques allow for the enhanced fabrication of fin structures with doped middle portions. For instance, the present techniques provide self aligned formation of doped middle portions of fin structures to reduce and/or eliminate leakage currents between source and drain regions (e.g., through lower portions of the fin structures which are not surrounded and/or controlled by a gate structure). In addition, the present techniques allow for formation of doped middle portions without introducing dopants into upper or lower portions of the fin structures to prevent threshold voltage mismatch and/or well leakage due to interruption of the well junctions. Further, the present techniques allow for the provision of multiple threshold voltages.

Reference is made below to the drawings, which are not drawn to scale for ease of understanding, wherein the same reference numbers used throughout different figures designate the same or similar components.

Figure 1:
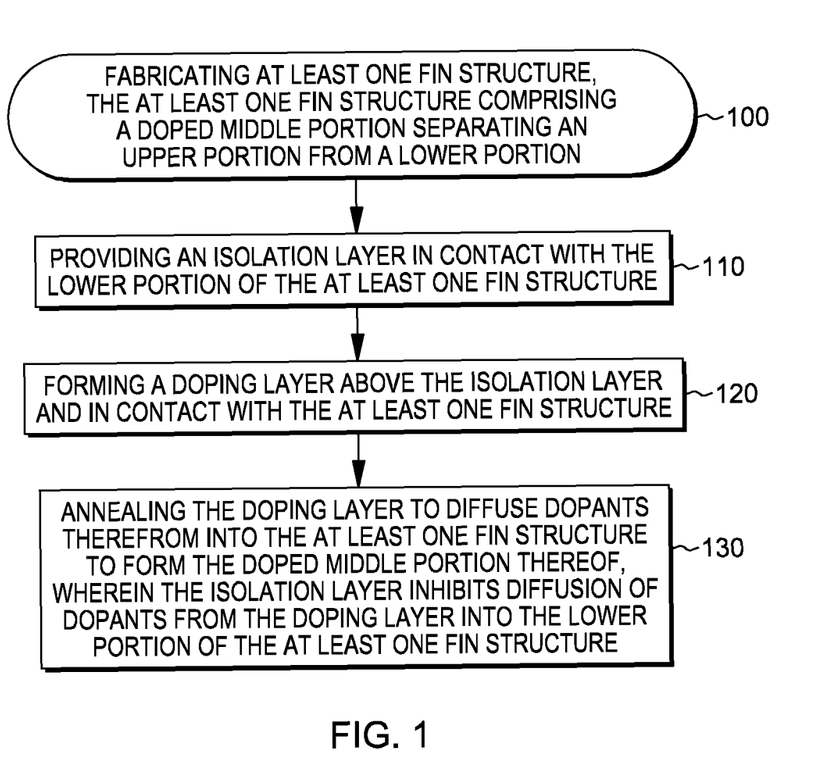
FIG. 1 depicts embodiments of processes for fabricating at least one fin structure, in accordance with one or more aspects of the present invention.

FIG. 1 depicts embodiments of processes for fabricating at least one fin structure, in accordance with one or more aspects of the present invention.

In one embodiment, a method includes fabricating at least one fin structure, the at least one fin structure comprising a doped middle portion separating an upper portion from a lower portion 100, and the fabricating 100 includes: providing an isolation layer in contact with the lower portion of the at least one fin structure 110; forming a doping layer above the isolation layer and in contact with the at least one fin structure 120; and annealing the doping layer to diffuse dopants therefrom into the at least one fin structure to form the doped middle portion thereof, wherein the isolation layer inhibits diffusion of dopants from the doping layer into the lower portion of the at least one fin structure 130.

In another embodiment, the method includes: fabricating a transistor having a channel region, the channel region comprising the upper portion of the at least one fin structure, where the doped middle portion of the at least one fin structure reduces leakage current between the source region and the drain region of the transistor (e.g., through a lower portion of the at least one fin structure).

In a further embodiment, the at least one fin structure comprises at least one first fin structure and at least one second fin structure, and the fabricating 100 comprises: forming the doping layer with a first thickness in contact with the at least one first fin structure and a second thickness in contact with the at least one second fin structure; and annealing the doping layer to form a first doped middle portion of the at least one first fin structure with the first thickness and a second doped middle portion of the at least one second fin structure with the second thickness, wherein the first thickness and the second thickness are different thicknesses.

In one implementation, the method comprises: fabricating an integrated circuit comprising a first transistor and a second transistor, the first transistor comprising the at least one first fin structure and the second transistor comprising the at least one second fin structure, and the first thickness of the first doped middle portion facilitates the first transistor having a first threshold voltage characteristic and the second thickness of the second doped middle portion facilitates the second transistor having a second threshold voltage characteristic, wherein the first threshold voltage characteristic and the second threshold voltage characteristic are different threshold voltage characteristics.

In another implementation, the at least one fin structure comprises at least one first fin structure and at least one second fin structure, and the fabricating 100 comprises: forming the doping layer with first dopants in contact with the at least one first fin structure and second dopants in contact with the at least one second fin structure, wherein the first dopants and second dopants are different dopants; and annealing the doping layer to form a first doped middle portion of the at least one first fin structure having the first dopants and a second doped middle portion of the at least one second fin structure having the second dopants. In such a case, the first dopants can comprise n-type dopants and the second dopants can comprise p-type dopants, and the method can comprise: fabricating an integrated circuit comprising a p-type transistor and an n-type transistor, the p-type transistor comprising the at least one first fin structure and the n-type transistor comprising the at least one second fin structure.

In a further implementation, the at least one fin structure comprises at least one first fin structure and at least one second fin structure, and the fabricating 100 comprises: forming the doping layer with a first initial dopant concentration in contact with the at least one first fin structure and a second initial dopant concentration in contact with the at least one second fin structure, wherein the first initial dopant concentration and the second initial dopant concentration are different concentrations; and annealing the doping layer to form a first middle portion of the at least one first fin structure with a first final dopant concentration and a second middle portion of the at least one second fin structure with a second final dopant concentration, wherein the first final dopant concentration and the second final dopant concentration are different dopant concentrations. In such a case, for example, the method comprises: fabricating an integrated circuit comprising a first transistor and a second transistor, the first transistor comprising the at least one first fin structure and the second transistor comprising the at least one second fin structure, and the first concentration of the dopants facilitates the first transistor having a first threshold voltage characteristic and the second concentration of the dopants facilitates the second transistor having a second threshold voltage characteristic, wherein the first threshold voltage characteristic and the second threshold voltage characteristic are different threshold voltage characteristics.

In one example, the fabricating 100 comprises: providing a substrate underlying the at least one fin structure; implanting other dopants into the substrate to form a substrate well region thereof, wherein the other dopants and the dopants of the doping layer are different dopants.

In another example, the fabricating 100 comprises fabricating the doped middle portion of the at least one fin structure without doping the upper portion or the lower portion of the at least one fin structure notwithstanding the diffusing of the dopants during the annealing.

In a further example, the method further includes: forming a conformal gate structure over the isolation material and in contact with the at least one fin structure, wherein the isolation material facilitates aligning the conformal gate structure in contact with the upper portion of the at least one fin structure but not in contact with the doped middle portion thereof.

In one embodiment, providing the isolation layer 110 comprises providing the isolation layer with a thickness, the thickness of the isolation layer setting the lower portion of the at least one fin structure with the thickness. In another embodiment, forming a doping layer 120 comprises forming the doping layer with a thickness, the thickness of the doping layer setting the doped middle portion of the at least one fin structure with the thickness. In a further embodiment, the annealing 120 comprises oxidizing the doping layer and the at least one fin structure.

In one implementation, forming the doping layer 120 comprises epitaxially forming a material over the at least one fin structure to form the doping layer. In such a case, in one example, the material comprises at least one of silicon or germanium. In another implementation, forming the doping layer 120 comprises providing a material, and concurrently therewith doping the material with the dopants, to form the doping layer. In a further implementation, the dopants comprise at least one of boron, phosphorous or arsenic.

In one example, forming the doping layer 120 comprises providing a borophosphosilicate glass to form the doping layer. In another example, a concentration of the dopants in the middle portion of the at least one fin structure is between $10^{18}$ to $10^{20}$ atoms per cm$^3$.

Figure 2A:
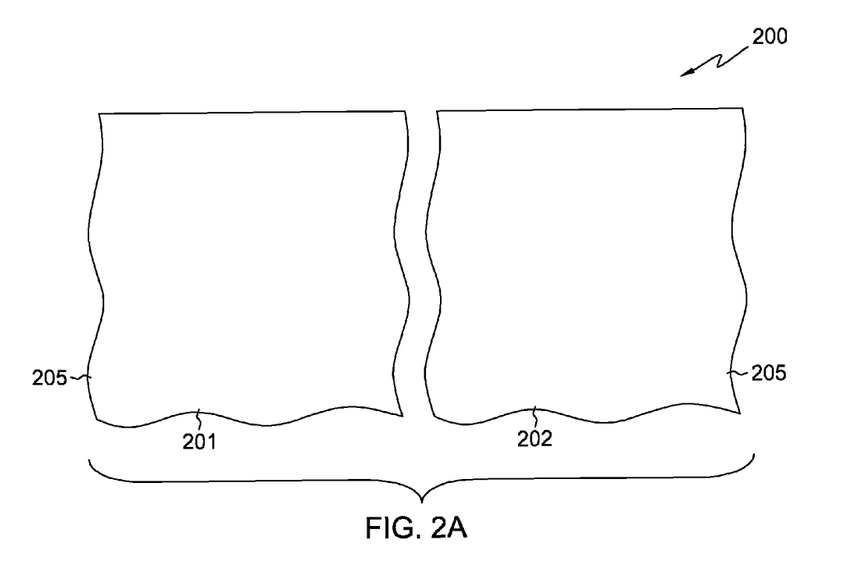
FIG. 2A is a cross sectional elevational view of a structure found in a semiconductor fabrication process, in accordance with one or more aspects of the present invention.

FIG. 2A is a cross sectional elevational view of a structure 200 found in a semiconductor fabrication process, in accordance with one or more aspects of the present invention. In the embodiment of FIG. 2A, structure 200 includes a substrate 205, and can have multiple regions such as first region 201 and second region 202.

By way of explanation, in one embodiment, substrate 205 can be a semiconductor wafer, such as a silicon wafer. For instance, in a semiconductor fabrication process, numerous integrated circuits, or chips, can be formed in multiple die regions of the semiconductor wafer. In addition, the semiconductor wafer can be subsequently diced into individual integrated circuits, or chips, and packaged for use in electronics devices or components. Further, during such a fabrication process, the techniques described herein can be used to form numerous different structures in numerous different regions of the substrate.

In one embodiment, substrate 205 can be a bulk semiconductor material such as a bulk silicon wafer. In another embodiment, substrate 205 can include silicon (Si), single crystal Si, polycrystalline Si, amorphous Si, Si-on-nothing (SON), Si-on-insulator (SOI), or Si-on-replacement insulator (SRI). In a further embodiment, substrate 205 can be n-type or p-type doped. In one particular example, substrate 205 can have a thickness of approximately 600-900 micrometers.

Figure 2B:
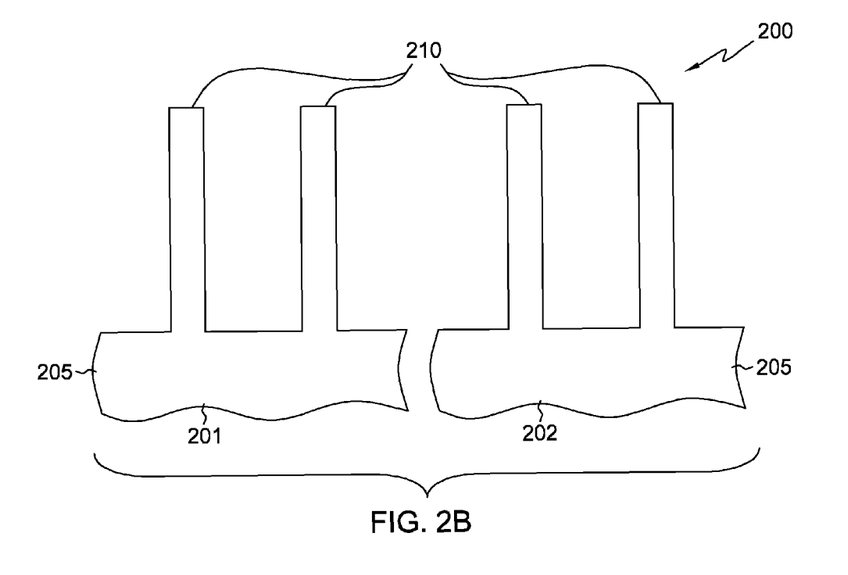
FIG. 2B depicts the structure of FIG. 2A after forming a fin structure(s) extending above a substrate thereof, in accordance with one or more aspects of the present invention.

FIG. 2B depicts structure 200 after forming fin structure(s) 210 extending above substrate 205, in accordance with one or more aspects of the present invention. In one embodiment, fin structure(s) 210 can be formed by removal of one or more portions of substrate 205, resulting in fin structure(s) formed of the same material as substrate 205, which may be, for example a semiconductor or crystalline material.

For instance, substrate 205 may be patterned with fin structure(s) 210 using one or more techniques, such as: direct lithography; sidewall image transfer technique; extreme ultraviolet lithography (EUV); e-beam technique; litho-etch litho-etch; or litho-etch litho-freeze. In such a case, following patterning, removal of material of substrate 205 can be achieved using any suitable etching process, for example, anisotropic dry etching or reactive-ion-etching (RIE) in sulfur hexafluoride ($SF_6$). Although the following numbers are relative and the heights could vary, in one specific example, fin structure(s) 210 can have a height of about 40 to 300 nanometers and a length of about one micrometer, several micrometers, or the diameter of the entire wafer, and the width of the fin structures can be approximately 1 to 20 nanometers.

In one embodiment, numerous fin structures may be formed over an entire wafer or an entire die of a wafer. In such an embodiment, the fin structures may be formed at the smallest critical dimension during a single initial fin structure formation process, and some portions of the fin structures can removed during subsequent fabrication steps.

Figure 2C:
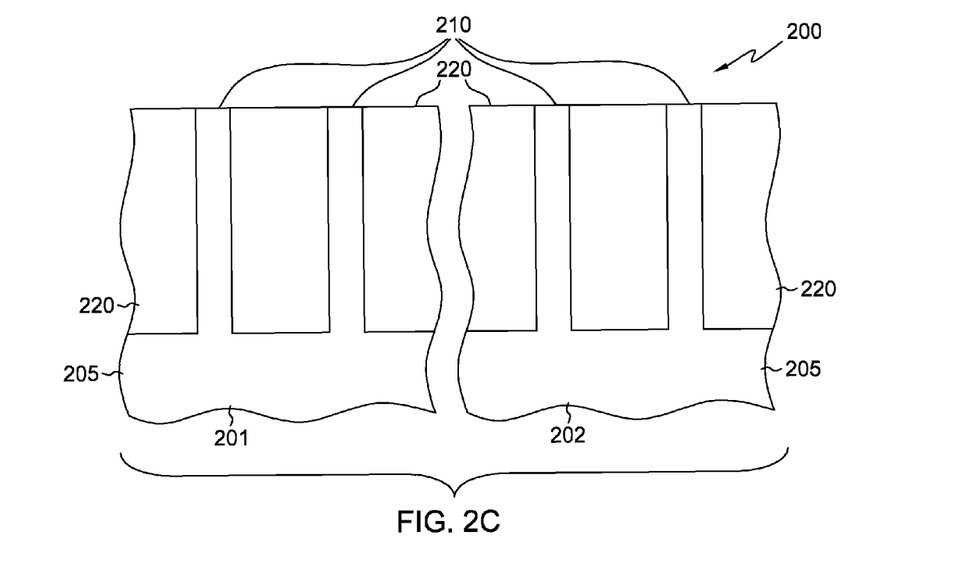
FIG. 2C depicts the structure of FIG. 2B after providing an isolation layer in contact with the fin structure(s) thereof, in accordance with one or more aspects of the present invention.

FIG. 2C depicts structure 200 after providing an isolation layer 220 in contact with the fin structure(s) 210 thereof, in accordance with one or more aspects of the present invention. In one embodiment, isolation layer 220 includes an insulator, for example an oxide such as silicon dioxide or tetraethyl orthosilicate. In another embodiment, isolation layer 220 can be provided using chemical vapor deposition or a high aspect ratio process. For example, isolation layer 220 can be provided in order to electrically isolate fin structures from one another.

Figure 2D:
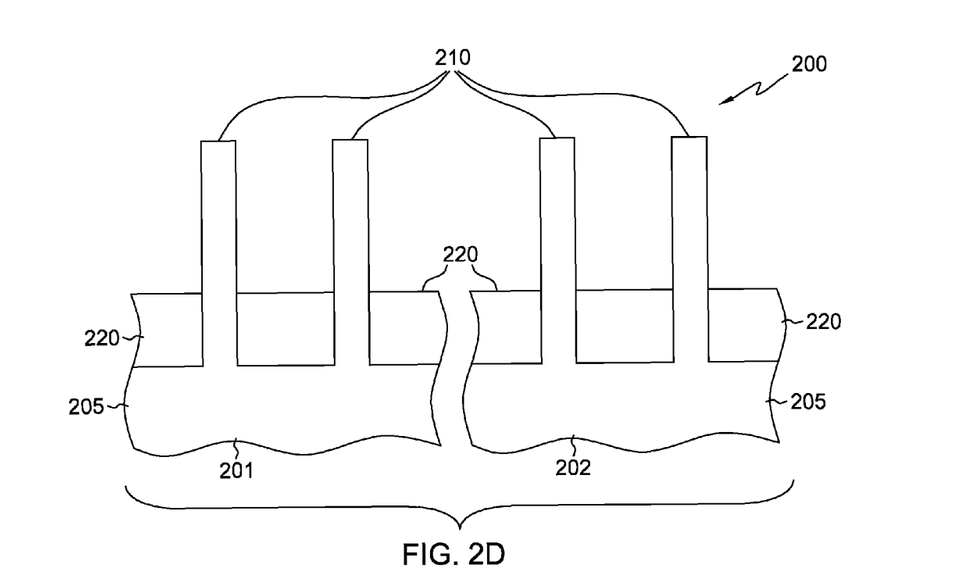
FIG. 2D depicts the structure of FIG. 2C after removing some of the isolation layer to reveal portion(s) of the fin structure(s) thereof, in accordance with one or more aspects of the present invention.

FIG. 2D depicts structure 200 after removing some of isolation layer 220 to reveal portion(s) of the fin structure(s)

210 thereof, in accordance with one or more aspects of the present invention. In one embodiment, a fin reveal process can employ any suitable etching process, for example, an isotropic dry etching process, to remove some of isolation layer 220 to reveal fin structure(s) 210. In one specific example, a dry etching process, such as a SiCoNi etching may be employed.

Figure 2E:
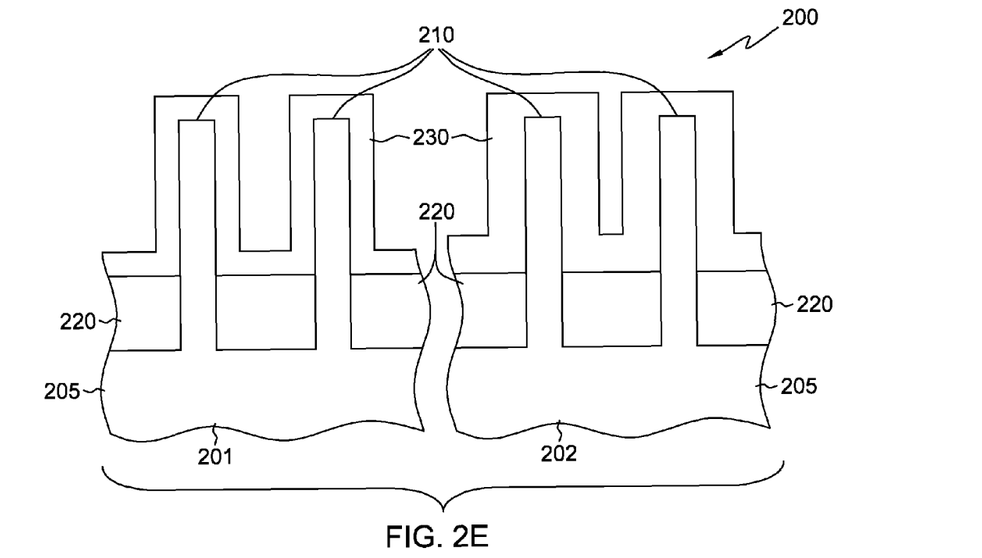
FIG. 2E depicts the structure of FIG. 2D after forming a doping layer above the isolation layer and in contact with the fin structure(s) thereof, in accordance with one or more aspects of the present invention.

FIG. 2E depicts structure 200 after forming a doping layer 230 above isolation layer 220 and in contact with fin structure(s) 210 thereof, in accordance with one or more aspects of the present invention. Doping layer 230 can be or include a variety of different materials that include n-type and/or p-type dopants in varying concentrations. N-type and p-type dopants are impurities that are added to modify electrical properties of semiconductors. For instance, n-type dopants include phosphorous, arsenic, and antimony, or any combination thereof, and p-type dopants include boron, gallium, and aluminum, or any combination thereof. In addition, doping layer 230 can have a concentration of approximately $10^{15}$ to $10^{23}$ atoms per $cm^3$.

In one embodiment, doping layer 230 is or includes a borophosphosilicate glass (BPSG), a phosphorous silicate glass (PSG), a boron silicate glass (BSG), or any combination thereof. In another embodiment, doping layer 230 is or includes an oxide, such as silicon dioxide. In a further embodiment, doping layer 230 is or includes a semiconductor material, such as silicon or silicon germanium.

In one example, doping layer 230 can be formed using chemical vapor deposition (CVD), atomic layer deposition (ALD), or spin coating. In another example, doping layer 230 can be formed by an epitaxial formation process (for example, if doping layer 230 includes a crystalline material).

For example, dopants may be introduced into doping layer 230 during formation above isolation layer 220 (for example, in situ doping). In addition, dopants may be introduced into the doping layer after the doping layer has been formed above the isolation layer, using, for example, ion implantation. In one specific example, dopants may be introduced with ion implantation with an energy of approximately 5-30 kilo electron volts (keV).

In one embodiment, doping layer 230 can be provided with different thicknesses in different regions of structure 200 through the use of a series of mask steps that selectively expose some regions and not others, followed by provision of material to form doping layer 230 with the appropriate thickness in the exposed regions. In another embodiment, material can be added (or removed) so that different regions have different thicknesses of the doping layer.

In a further embodiment, doping layer 230 can have different dopants in different regions and/or have different concentrations of dopants in different regions. For instance, one region can have n-type dopants, and another region can have p-type dopants, thereby facilitating formation of CMOS integrated circuits. In addition, different concentrations of the same and/or different dopants can be used to achieve multiple different threshold voltage characteristics for transistors formed in different regions (e.g., transistors having channel regions including the fin structures), because different doping concentrations can be used to tune threshold voltage characteristics because the dopants under a channel region of a transistor can change the electrical properties of the operational transistors.

Figure 2F:
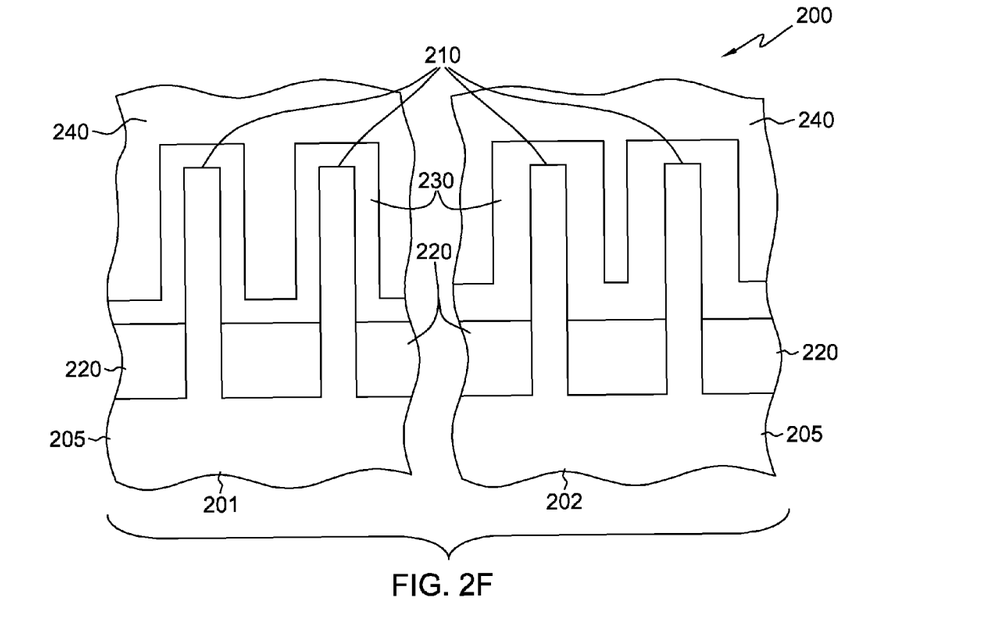
FIG. 2F depicts the structure of FIG. 2E after providing another isolation layer above the doping layer thereof, in accordance with one or more aspects of the present invention.
Figure 2G:
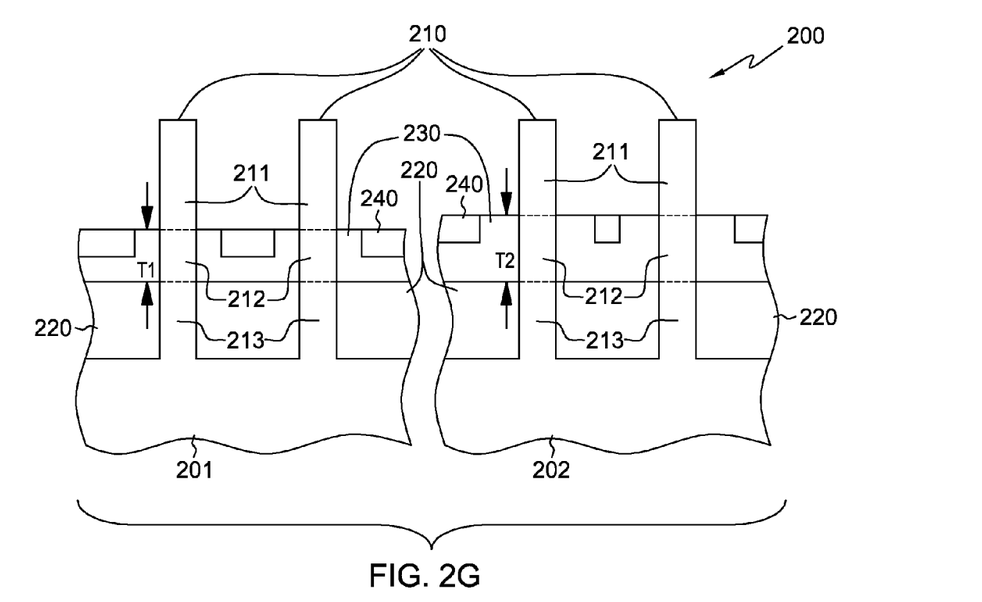
FIG. 2G depicts the structure of FIG. 2F after recessing the doping layer to reveal an upper portion(s) of the fin structure(s) thereof, in accordance with one or more aspects of the present invention.

FIG. 2F depicts structure 200 after providing another isolation layer 240 above doping layer 230 thereof, in accordance with one or more aspects of the present invention. In one embodiment, isolation layer 240 can include any of the materials described above with respect to isolation layer 220, and isolation layer 240 can include the same materials or different materials as isolation layer 220. using a deposition process to provide an isolation layer fill material;

FIG. 2G depicts structure 200 after recessing doping layer 230 to reveal upper portion(s) 211 of fin structure(s) 210 thereof, in accordance with one or more aspects of the present invention.

In the embodiment of FIG. 2G, doping layer 230 has been recessed to the level of isolation layer 240. For instance, isolation layer 240 can be recessed by: chemical mechanical polishing the isolation layer 240 to form a flat surface (e.g., a flat surface in which isolation layer 240 and the top of fin structures 210 are co-planar); etching isolation layer 240 and doping layer 230 to achieve the desired thickness in contact with fin structure(s) 210, for example using a dry and/or wet etching process that removes the material of isolation layer 240 and the material of doping layer 230, but not the material of fin structure(s) 210.

In such a case, upper surfaces of isolation layer 240 and doping layer 230 can be co-planar, and specific thicknesses of doping layer 230 in contact with fin structure(s) 210 can be achieved. As illustrated, after recessing, doping layer 230 is provided with a first thickness $T_1$ in first region 201 and a second thickness $T_2$ in second region 201.

In one embodiment, numerous different regions of structure 200 can be defined, with doping layer 230 provided with a different thickness in each such region. In addition, dozens of different regions could be defined, with a different thickness of doping layer 230 in each such region.

Figure 2H:
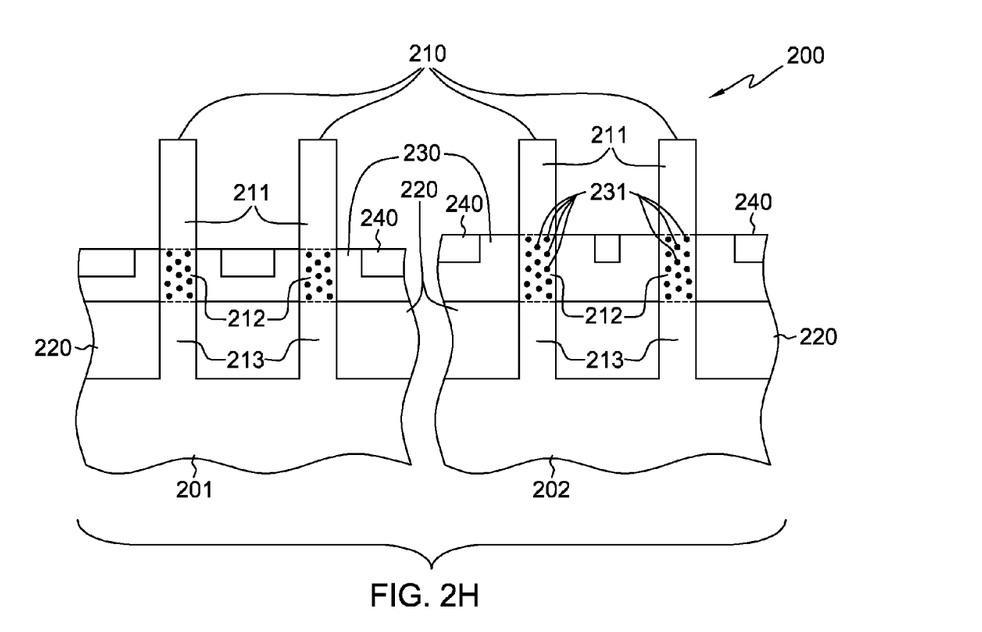
FIG. 2H depicts the structure of FIG. 2G after annealing the doping layer to diffuse dopants thereof into the fin structure(s) to form doped middle portion(s) thereof, in accordance with one or more aspects of the present invention.

FIG. 2H depicts structure 200 after annealing doping layer 230 to diffuse dopants 231 into fin structure(s) 210 to form doped middle portion(s) 212 thereof, in accordance with one or more aspects of the present invention. In one embodiment, isolation layer 220 inhibits diffusion of dopants 231 from doping layer 230 into lower portion(s) 213 of the at least one fin structure. In another embodiment, because doping layer 230 is not in contact with upper portions of the fin structures, no dopants will diffuse into the upper portions.

In one example, after annealing doping layer 230, doped middle portion(s) 212 of fin structure(s) 210 can have a dopant concentration of approximately $10^{18}$ to $10^{20}$ atoms per $cm^3$. In another example, dopants 231 laterally diffuse from doping layer 230 into middle portion(s) 212 of fin structure(s) 210. In a further example, the doping layer can be in contact with both sides of the fin structure, thereby facilitating uniform doping of the middle portions of the fin structures.

In one embodiment, the annealing can be thermal furnace annealing, rapid thermal annealing, or laser annealing. In one specific example, thermal furnace annealing can be used at a temperature of 600-1,000° C. for 5-30 minutes.

In the embodiment of FIG. 2H, first doped middle portion(s) 212 of fin structure(s) 210 in first region 201 can have a first thickness $T_1$, and second doped middle portion(s) 212 of fin structure(s) 210 in second region 201 can have a second thickness $T_2$.

Figure 2I:
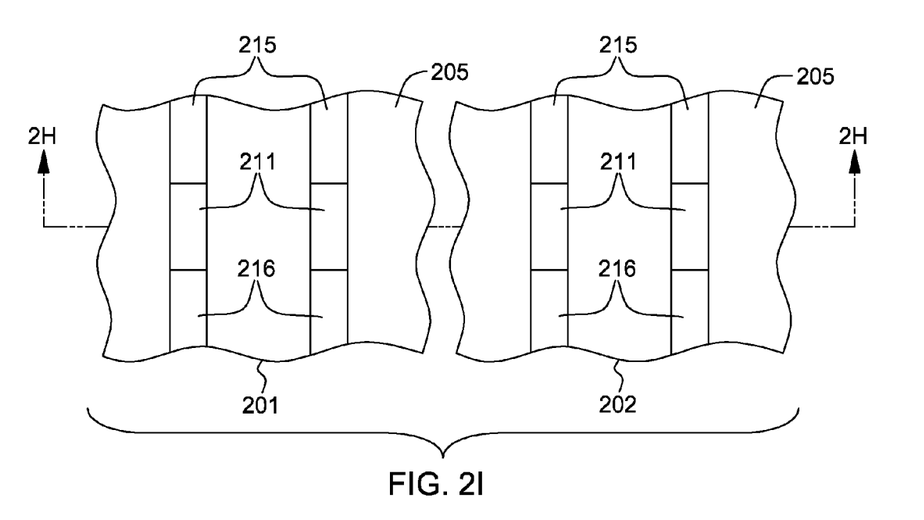
FIG. 2I is a plan view of the structure of FIG. 2H, in accordance with one or more aspects of the present invention.

FIG. 2I is a plan view of structure 200, in accordance with one or more aspects of the present invention. As indicated in FIG. 2I, the cross sectional elevational view of FIG. 2H is taken along line 2H-2H of FIG. 2I. In the plan view of FIG. 2I, structure 200 is or includes an integrated circuit having, for example, first transistors in first region 201 and second transistors in second region 202.

In one embodiment, each transistor has a source region 215 separated from a drain region 216 by a channel region which is or includes an upper portion 211 of a fin structure 210 (see FIG. 2H). In addition, a channel region of the transistor can include multiple fin structures 210, so that the transistor can have a greater amount of current flow during its on-state. Further, source regions 215 and drain regions 216 can be fabricated by forming cavities in the fin structures 210 and then providing a semiconductor material within the cavities. For example, source regions 215 and drain regions 216 can be epitaxially formed with in the cavities, such as by growing a semiconductor material (e.g., silicon or silicon germanium) therein.

In another embodiment, the doped middle portion of fin structure(s) 210 reduces leakage current between the channel region of the transistor and the lower portion of fin structure(s) 210, including, for example, substrate 205. For example, leakage current can be reduced during operation of the transistor, such as when the transistor is in the on-state, thereby reducing power consumption and/or heat generation.

In a further embodiment, a first transistor in first region 210 can include first fin structure(s) 210 and a second transistor in second region 210 can include second fin structure(s) 210. In such a case, first thickness $T_1$ of first doped middle portion(s) 212 facilitates the first transistor having a first threshold voltage characteristic and the second thickness $T_2$ of second doped middle portion(s) facilitates the second transistor having a second threshold voltage characteristic, where the first threshold voltage characteristic and the second threshold voltage characteristic are different threshold voltage characteristics. In a similar manner, numerous regions can be formed with numerous threshold voltages. For example, three different p-type regions can be defined with three different threshold voltages, and three different n-type regions can be defined with three same or similar threshold voltages, such as a regular threshold voltage (RVT) greater than a low threshold voltage (LVT) greater than a super-low threshold voltage (SLVT). In such a case, CMOS circuits can be formed using matched n-type and p-type transistors with the same or similar threshold voltages.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
fabricating at least one fin structure, the at least one fin structure comprising a doped middle portion separating an upper portion from a lower portion, and the fabricating comprising:
providing an isolation layer in contact with the lower portion of the at least one fin structure;
forming a doping layer above the isolation layer and in contact with the at least one fin structure; and
annealing the doping layer to diffuse dopants therefrom into the at least one fin structure to form the doped middle portion thereof, wherein the isolation layer inhibits diffusion of dopants from the doping layer into the lower portion of the at least one fin structure.

2. The method of claim 1, wherein the method comprises:
fabricating a transistor having a channel region, the channel region comprising the upper portion of the at least one fin structure, wherein the doped middle portion of the at least one fin structure reduces leakage current between the source region and the drain region of the transistor.

3. The method of claim 1, wherein the at least one fin structure comprises at least one first fin structure and at least one second fin structure, and the fabricating comprises:
forming the doping layer with a first thickness in contact with the at least one first fin structure and a second thickness in contact with the at least one second fin structure; and
annealing the doping layer to form a first doped middle portion of the at least one first fin structure with the first thickness and a second doped middle portion of the at least one second fin structure with the second thickness, wherein the first thickness and the second thickness are different thicknesses.

4. The method of claim 3, wherein the method comprises:
fabricating an integrated circuit comprising a first transistor and a second transistor, the first transistor comprising the at least one first fin structure and the second transistor comprising the at least one second fin structure, and the first thickness of the first doped middle portion the first transistor having a first threshold voltage characteristic and the second thickness of the second doped middle portion facilitates the second transistor having a second threshold voltage characteristic, wherein the first threshold voltage characteristic and the second threshold voltage characteristic are different threshold voltage characteristics.

5. The method of claim 1, wherein the at least one fin structure comprises at least one first fin structure and at least one second fin structure, and the fabricating comprises:
forming the doping layer with first dopants in contact with the at least one first fin structure and second dopants in contact with the at least one second fin structure, wherein the first dopants and second dopants are different dopants; and
annealing the doping layer to form a first doped middle portion of the at least one first fin structure having the first dopants and a second doped middle portion of the at least one second fin structure having the second dopants.

6. The method of claim 5, wherein the first dopants comprise n-type dopants and the second dopants comprise p-type dopants, and the method comprises:
fabricating an integrated circuit comprising a p-type transistor and an n-type transistor, the p-type transistor comprising the at least one first fin structure and the n-type transistor comprising the at least one second fin structure.

7. The method of claim 1, wherein the at least one fin structure comprises at least one first fin structure and at least one second fin structure, and the fabricating comprises:
forming the doping layer with a first initial dopant concentration in contact with the at least one first fin structure and a second initial dopant concentration in contact with the at least one second fin structure, wherein the first initial dopant concentration and the second initial dopant concentration are different concentrations; and
annealing the doping layer to form a first middle portion of the at least one first fin structure with a first final dopant concentration and a second middle portion of the at least one second fin structure with a second final dopant concentration, wherein the first final dopant concentration and the second final dopant concentration are different dopant concentrations.

8. The method of claim 7, wherein the method comprises:
fabricating an integrated circuit comprising a first transistor and a second transistor, the first transistor comprising the at least one first fin structure and the second transistor comprising the at least one second fin structure, and the first concentration of the dopants facilitates the first transistor having a first threshold voltage characteristic and the second concentration of the dopants facilitates the second transistor having a second threshold voltage characteristic, wherein the first threshold voltage characteristic and the second threshold voltage characteristic are different threshold voltage characteristics.

9. The method of claim 1, wherein the fabricating comprises:
providing a substrate underlying the at least one fin structure;
implanting other dopants into the substrate to form a substrate well region thereof, wherein the other dopants and the dopants of the doping layer are different dopants.

10. The method of claim 1, wherein the fabricating comprises fabricating the doped middle portion of the at least one fin structure without doping the upper portion or the lower portion of the at least one fin structure notwithstanding the diffusing of the dopants during the annealing.

11. The method of claim 1, further comprising:
forming a conformal gate structure over the isolation material and in contact with the at least one fin structure, wherein the isolation material facilitates aligning the conformal gate structure in contact with the upper portion of the at least one fin structure but not in contact with the doped middle portion thereof.

12. The method of claim 1, wherein providing the isolation layer comprises providing the isolation layer with a thickness, the thickness of the isolation layer setting the lower portion of the at least one fin structure with the thickness.

13. The method of claim 1, wherein forming a doping layer comprises forming the doping layer with a thickness, the thickness of the doping layer setting the doped middle portion of the at least one fin structure with the thickness.

14. The method of claim 1, wherein the annealing comprises oxidizing the doping layer and the at least one fin structure.

15. The method of claim 1, wherein forming the doping layer comprises epitaxially forming a material over the at least one fin structure to form the doping layer.

16. The method of claim 15, wherein the material comprises at least one of silicon or germanium.

17. The method of claim 1, wherein forming the doping layer comprises providing a material, and concurrently therewith doping the material with the dopants, to form the doping layer.

18. The method of claim 17, wherein the dopants comprise at least one of boron, phosphorous or arsenic.

19. The method of claim 1, wherein forming the doping layer comprises providing a borophosphosilicate glass to form the doping layer.

20. The method of claim 1, wherein a concentration of the dopants in the middle portion of the at least one fin structure is between $10^{18}$ to $10^{20}$ atoms per $cm^3$.

* * * * *